(12) United States Patent
Fukao et al.

(10) Patent No.: US 12,273,996 B2
(45) Date of Patent: Apr. 8, 2025

(54) FIBER SHEET, AND LAYERED BODY, CIRCUIT BOARD AND ELECTRONIC BOARD USING SAME

(71) Applicant: PANASONIC INTELLECTUAL PROPERTY MANAGEMENT CO., LTD., Osaka (JP)

(72) Inventors: Tomohiro Fukao, Osaka (JP); Tomoaki Sawada, Osaka (JP); Takatoshi Abe, Osaka (JP); Kyosuke Michigami, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 56 days.

(21) Appl. No.: 17/441,492

(22) PCT Filed: Mar. 26, 2020

(86) PCT No.: PCT/JP2020/013827
§ 371 (c)(1),
(2) Date: Sep. 21, 2021

(87) PCT Pub. No.: WO2020/196790
PCT Pub. Date: Oct. 1, 2020

(65) Prior Publication Data
US 2022/0183154 A1    Jun. 9, 2022

(30) Foreign Application Priority Data
Mar. 27, 2019 (JP) .................. 2019-061650

(51) Int. Cl.
*H05K 1/03* (2006.01)
*B32B 5/02* (2006.01)
(Continued)

(52) U.S. Cl.
CPC ............ *H05K 1/036* (2013.01); *B32B 5/024* (2013.01); *B32B 15/08* (2013.01); *B32B 27/12* (2013.01);
(Continued)

(58) Field of Classification Search
CPC ...... H05K 1/036; H05K 1/0393; B32B 5/024; B32B 5/08; B32B 27/12; B32B 2260/021;
(Continued)

(56) References Cited

U.S. PATENT DOCUMENTS

| 4,997,702 A | * | 3/1991 | Gazit ..................... B32B 27/08 428/209 |
| 2013/0041235 A1 | * | 2/2013 | Rogers ................. H05K 1/0283 600/386 |

(Continued)

FOREIGN PATENT DOCUMENTS

| JP | S59-138439 | 8/1984 |
| JP | S61-043661 | 3/1986 |

(Continued)

OTHER PUBLICATIONS

ISR issued in WIPO Patent Application No. PCT/JP2020/013827, Jun. 23, 2020, English translation.

*Primary Examiner* — Michael Zhang
(74) *Attorney, Agent, or Firm* — GREENBLUM & BERNSTEIN, P.L.C.

(57) ABSTRACT

A fiber sheet includes: a resin layer containing a thermosetting resin; and a fiber layer, wherein the fiber sheet is stretchable by 1% or more, and an initial tensile elastic modulus of the fiber sheet is 1 MPa or more and 1 GPa or less.

15 Claims, 6 Drawing Sheets

(51) Int. Cl.
    *B32B 15/08*         (2006.01)
    *B32B 27/12*         (2006.01)

(52) U.S. Cl.
    CPC ...... *H05K 1/0393* (2013.01); *B32B 2260/021* (2013.01); *B32B 2260/046* (2013.01); *B32B 2307/51* (2013.01); *B32B 2457/08* (2013.01)

(58) Field of Classification Search
    CPC .......... B32B 2260/046; B32B 2307/51; B32B 2457/08
    See application file for complete search history.

(56) References Cited

U.S. PATENT DOCUMENTS

| | | | |
|---|---|---|---|
| 2015/0075852 A1 | 3/2015 | Inoue et al. | |
| 2016/0157343 A1* | 6/2016 | Abe | H05K 1/028 |
| | | | 523/400 |
| 2017/0145189 A1 | 5/2017 | Kang et al. | |
| 2018/0020936 A1 | 1/2018 | Kwon et al. | |
| 2019/0053372 A1 | 2/2019 | Kwon et al. | |
| 2020/0291273 A1* | 9/2020 | Kwon | H01B 1/24 |
| 2021/0007223 A1 | 1/2021 | Kwon et al. | |
| 2022/0201850 A1* | 6/2022 | Abe | H05K 1/0283 |

FOREIGN PATENT DOCUMENTS

| | | |
|---|---|---|
| JP | 2007-214202 A | 8/2007 |
| JP | 3204003 | 5/2016 |
| JP | 2018-080281 | 5/2018 |
| JP | 2018-102965 | 7/2018 |
| WO | 2014/141689 | 9/2014 |
| WO | 2017/138388 | 8/2017 |

* cited by examiner

FIBER SHEET, AND LAYERED BODY, CIRCUIT BOARD AND ELECTRONIC BOARD USING SAME

TECHNICAL FIELD

The present invention relates to a fiber sheet, and a laminate, a circuit board, and an electronic board which use the fiber sheet.

BACKGROUND ART

A demand for higher wearability and higher shape followability has been increased with respect to devices and conductive materials used as various interfaces with an electronic field, particularly sensors, displays, artificial skin for robots, and the like. There has been a demand for a flexible device that can be disposed on a curved surface, an uneven surface or the like, and is freely deformable according to the application.

Stretchable conductive sheets that are used for such flexible devices (for example, a wearable device or the like) have been already reported. For example, there has been reported a technique in which a stretchable electrode sheet is manufactured by preparing a stretchable conductor layer using a conductive paste that contains a stretchable resin, by laminating a hot melt sheet to the stretchable electrode sheet, by bringing the stretchable conductor layer into contact with a fabric, and by performing hot pressing. Using such a stretchable electrode sheet, an interface for measuring biological information is obtained (Patent Literature 1). There has been also reported a technique in which, in a plastic yarn improved structure, a conductive wire is wrapped in a thermosetting polymer adhesive, the adhesive is solidified by applying heat to the adhesive so that the conductive wire is laminated to a base layer such as paper or a fabric body (Patent Literature 2).

However, when a hot melt sheet is used as in the technique described in Patent Literature 1, a normal hot melt sheet has no heat resistance, and hence, mounting of components by reflow soldering or the like cannot be performed. Furthermore, there is a risk that the sheet may be torn. Further, there is also a problem that sufficient integrity between the conductor layer and the fabric cannot be obtained by lamination using the hot melt sheet. Also in the technique described in Patent Literature 2, it is considered that a problem arises that a layer formed of a thermosetting polymer adhesive is torn. Furthermore, also in this technique, the thermosetting polymer adhesive is solidified by heat and is bonded to the base layer, or a tacky surface is further formed on the base layer and the thermosetting polymer adhesive is bonded to the tacky surface. However, even in this technique, integrity between the base layer such as a fabric body and the adhesive layer which wraps the conductive wire is not sufficiently obtained.

The present invention has been made in view of such circumstances, and it is an object of the present invention is to provide a fiber sheet having a resin layer excellent in heat resistance and stretchability, which can be used for various applications.

CITATION LIST

Patent Literature

PTL 1: JP 2018-102965 A
PTL 2: JP 3204003 U

SUMMARY OF INVENTION

As a result of intensive studies made by the inventors of the present invention, the inventors have found that the above problems can be solved by a conductive composition having the following configuration, and have completed the present invention by further conducting studies based on such finding.

That is, according to one aspect of the present invention, there is provided a fiber sheet which includes: a resin layer containing a thermosetting resin; and a fiber layer, wherein the fiber sheet is stretchable by 1% or more, and an initial tensile elastic modulus of the fiber sheet is 1 MPa or more and 10 GPa or less.

Furthermore, according to another aspect of the present invention, there is provided a laminate, wherein two or more of the above-mentioned fiber sheets are laminated.

According to still another aspect of the present invention, there is provided a circuit board configured to use the above-mentioned fiber sheet or the above-mentioned laminate.

According to still another aspect of the present invention, there is provided an electronic board including: the above-mentioned fiber sheet or the above-mentioned laminate; and an electronic component.

DESCRIPTION OF EMBODIMENTS

According to the present invention, it is possible to provide a fiber sheet having a resin layer excellent in heat resistance and stretchability, which can be used for various applications.

Furthermore, a resin layer having high heat resistance may be formed on a portion or the whole of the fiber layer, and a conductor layer may be formed on a surface or in the resin layer. With such a configuration, it is possible to provide an electronic board or a circuit board that is integrated with a fabric without impairing a texture of the fabric and has high durability against stretching and shrinking.

Furthermore, since the fiber sheet according to the present invention has the above characteristics, the fiber sheet of the present invention is applicable to various technical fields such as an optical field, an electronic field, an adhesion field, and a medical field in addition to an IoT and a flexible display device. In this manner, the fiber sheet of the present invention is extremely advantageous in industrial applications.

Hereinafter, an embodiment according to the present invention will be specifically described. However, the present invention is not limited the embodiment.

<Fiber Sheet>

Figure 1:
FIG. 1 is a schematic cross-sectional view illustrating a configuration of a fiber sheet according to an embodiment of the present invention.

As illustrated in FIG. 1, a fiber sheet according to the present embodiment includes: a resin layer 2 containing a thermosetting resin; and a fiber layer 1. The fiber sheet is stretchable by 1% or more, and has an initial tensile elastic modulus of 1 MPa or more and 10 GPa or less.

With the above configuration, it is possible to provide the fiber sheet having the resin layer excellent in heat resistance and stretchability.

According to the present embodiment, the initial tensile elastic modulus means an elastic modulus when the sheet is stretched by 1%. The condition that the initial tensile elastic modulus is 1 MPa or more means that the fiber sheet according to the present embodiment is a sheet that is stretchable by at least 1% or more. The fiber sheet is more preferably a sheet that is stretchable by 5% or more. With the provision of the fiber sheet that is stretchable by 1%, it is possible to provide an electronic board or a circuit board that is integrated with a fabric without impairing a texture of the fabric and has high durability against stretching and shrinking. The stretchable upper limit is not particularly limited, but 100% is sufficient.

A state where an initial tensile elastic modulus is less than 1 MPa is not desirable, because there is a problem that a restoring force of the fiber sheet is insufficient and the fiber sheet does not return to an initial shape. On the other hand, when the initial tensile elastic modulus exceeds 10 GPa, the fiber sheet exhibits insufficient stretchability. Accordingly, when the fiber sheet is used for producing a clothing, for example, there is a problem that a wearer who wears the clothing feels a discomfort. The initial tensile elastic modulus of the fiber sheet according to the present embodiment is preferably 5 MPa or more and 1 GPa or less, and is more preferably 5 MPa or more and 500 MPa or less.

According to the present embodiment, the initial tensile elastic modulus can be measured by a method in which the fiber sheet is cut into a predetermined size, and an elastic modulus is calculated when the fiber sheet is stretched to 1% (stretching: %) at a constant moving speed.

Hereinafter, the configuration of the respective portions of the fiber sheet according to the present embodiment will be described in detail. In the drawings appearing in the following description, reference numerals indicate the following portions: 1 indicates a fiber layer, 2 indicates a resin layer, 3 indicates a conductor layer (copper foil), 4 indicates a conductor layer (stretchable positive conductive paste), 5 indicates an electronic component, and 6 indicates a solder.

(Resin Layer)

As long as the resin layer of the fiber sheet according to the present embodiment contains a thermosetting resin, and is a resin layer in which an initial tensile elastic modulus of the fiber sheet falls within the above-mentioned range, the resin layer is not particularly limited. The resin layer of the present embodiment can be formed by using a thermosetting resin generally used as a stretchable insulating layer of an electronic base material. The resin layer according to the present embodiment may contain a thermosetting resin. In this case, the resin layer exhibits high heat resistance. Accordingly, for example, even in a high-temperature atmosphere when an electronic component is mounted, the resin layer can be used as a resin layer whose melting and thermal decomposition are suppressed.

In the fiber sheet according to the present embodiment, the resin layer may be formed on the entire surface of one side or both sides of the fiber layer. However, the resin layer may be formed on at least a portion of the surface of at least one side of the fiber layer as illustrated in FIG. 1.

Figure 2:
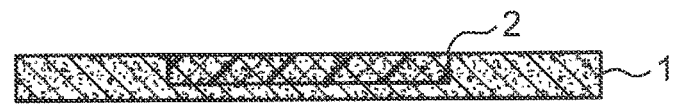
FIG. 2 is a schematic cross-sectional view illustrating a configuration of a fiber sheet according to another embodiment of the present invention.
Figure 3:
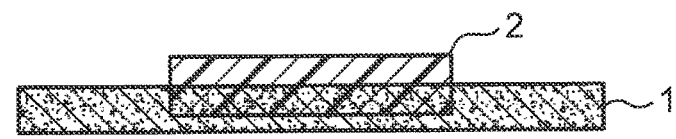
FIG. 3 is a schematic cross-sectional view illustrating a configuration of a fiber sheet according to still another embodiment of the present invention.

Furthermore, as illustrated in FIG. 2, the fiber layer 1 may be impregnated with the resin layer 2. Alternatively, as illustrated in FIG. 3, at least a portion of one surface of the fiber layer 1 is impregnated with not the whole of the resin layer 2 but with a portion of the resin layer 2. Although not illustrated, as a matter of course, a mode where both surfaces of the fiber layer are impregnated with the resin layer (including a case where both surfaces of the fiber layer are impregnated with at least a portion of the resin layer) falls within the scope of the present invention.

In particular, when the fiber layer is impregnated with at least a portion of the resin layer, it is considered that the resin layer and the fiber layer are further integrated, and breakage or the like of the fiber sheet hardly occurs.

Further, in the fiber sheet according to the present embodiment, a thickness of the resin layer is not particularly limited, and can be appropriately set depending on application. For example, it is preferable that the thickness of the resin layer falls within a range of 50 μm to 5000 μm from a viewpoint of handling property, optical characteristics, and wearability.

In the present embodiment, a thermosetting resin preferably includes at least an epoxy resin. In this case, it is considered that the fiber sheet can acquire heat resistance with more certainty.

The thermosetting resin and the resin layer preferably have a glass transition temperature of 60° C. or lower. In this case, it is possible to impart larger flexibility to the fiber sheet. It is not particularly necessary to set a lower limit value with respect to a glass transition temperature. However, from a viewpoint of avoiding sticking of the thermosetting resin and the resin layer at a normal temperature, the glass transition temperature is preferably set to −40° C. or higher.

The thermosetting resin is preferably stretchable by 1% or more. In this case, the fiber sheet is stretchable by 1% or more. The thermosetting resin preferably has an initial tensile elastic modulus of 1 MPa or more and 10 GPa or less. In this case, the fiber sheet has an initial tensile elastic modulus of 1 MPa or more and 10 GPa or less.

As long as the resin composition used in the resin layer of the present embodiment has the characteristics described above, the composition thereof is not particularly limited.

For example, the resin composition of the present embodiment preferably contains a polyrotaxane resin or an epoxy resin as a thermosetting resin. It is particularly desirable that the resin composition contain an epoxy resin. It is more preferable that the resin composition contain a curing agent. In this case, it is possible to obtain the fiber sheet having sufficient heat resistance and capable of resisting heat generated when components are mounted in a reflow process. Further, by curing the uncured resin composition after the uncured resin composition is laminated to the fiber layer, the resin layer and the fiber layer can be easily integrated with each other.

One of more specific embodiments of the resin composition includes, for example, a resin composition that contains a polyrotaxane (A), a thermosetting resin (B), and a curing agent (C). Hereinafter, respective components will be described more specifically.

Specific examples of the polyrotaxane (A) include polyrotaxanes described in, for example, JP 4482633 B2 or WO 2015/052853 A. A commercially available product may be used. Specifically, a SeRM Super Polymer A1000 manufactured by Advanced Softmaterials Inc. or the like can be used.

Next, examples of the thermosetting resin (B) include a thermosetting resin such as an epoxy resin, a phenol resin, a polyimide resin, a urea resin, a melamine resin, an unsaturated polyester, and a urethane resin, although the thermosetting resin (B) is not particularly limited to these resins. Among these resins, however, an epoxy resin is preferably used.

Specific examples of the epoxy resin include a bisphenol A epoxy resin, a bisphenol F epoxy resin, a bisphenol S epoxy resin, an aralkyl epoxy resin, a phenol novolac epoxy resin, an alkylphenol novolac epoxy resin, a biphenol epoxy resin, a naphthalene epoxy resin, a dicyclopentadiene epoxy resin, an epoxidized product of a condensate of a phenol and an aromatic aldehyde having a phenolic hydroxyl group, triglycidyl isocyanurate, and an alicyclic epoxy resin. These epoxy resins may be used such that one kind of epoxy resin is used alone or two or more kinds of epoxy resins are used in combination depending on the situation.

The epoxy resin is more preferably, for example, an epoxy resin containing two or more epoxy groups in one molecule and having a molecular weight of 500 or more. As such an epoxy resin, a commercially available epoxy resin may be used, and examples thereof include JER1003 (manufactured by Mitsubishi Chemical Corporation, molecular weight: 1300, bifunctional), EXA4816 (manufactured by DIC Corporation, molecular weight: 824, bifunctional), and YP50 (manufactured by Nippon Steel Sumitomo Metal Chemical Co., Ltd., molecular weight: 60000 to 80000, bifunctional).

As another example of the epoxy resin, an epoxy resin contains a thermosetting resin (B) and a curing agent (C), wherein the thermosetting resin (B) is an epoxy resin which includes an alkylene oxide-modified group having 2 to 3 carbon atoms, 4 mol or more of the modified group are contained in 1 mol of epoxy molecule, the epoxy resin includes an epoxy group of 2 mol or more, and an epoxy equivalent is 450 eq/mol or more. By curing such a product, it is possible to obtain a resin composition having the stretchability and the tensile elastic modulus. Specific examples of such an epoxy resin include a propylene oxide addition type bisphenol A type epoxy resin (EP4003S manufactured by ADEKA Corporation), and an ethylene oxide addition type hydroxyphenyl fluorene type epoxy resin (EG280 manufactured by Osaka Gas Chemicals Co., Ltd.).

The resin composition which contains a single component selected from either the polyrotaxane (A) or the thermosetting resin (B) and the curing agent (C) may be used. However, from a viewpoint that the resin composition having the stretchability and the tensile elastic modulus can be easily obtained using a cured product of the resin composition which contains both components ((A) and (B)) and the curing agent (C), the resin composition which contains both components ((A) and (B)) and the curing agent (C) is desirable. With respect to the epoxy resins described above, one kind of epoxy resin may be used alone, or two or more kinds of epoxy resins may be used in combination.

The curing agent (C) is not particularly limited as long as the curing agent (C) acts as a curing agent for the thermosetting resin (B). In particular, examples of curing agents that can be preferably used as a curing agent for an epoxy resin include a phenol resin, an amine-based compound, an acid anhydride, an imidazole-based compound, a sulfide resin, and a dicyandiamide. Further, a light/ultraviolet curing agent, a thermal cation curing agent and the like can also be used. These epoxy resins may be used such that one kind of epoxy resin is used alone or two or more kinds of epoxy resins are used in combination depending on the situation. The resin composition may contain a curing accelerator when necessary. Examples of the curing accelerator include imidazole-based compounds.

In a case where the resin composition according to the present embodiment is a resin composition which contains polyrotaxane, the resin composition may further contain a crosslinking agent. The crosslinking agent is not particularly limited as long as the crosslinking agent can form a structure crosslinked with at least a portion of a cyclic molecule of polyrotaxane (at least one reactive group of a cyclic molecule of polyrotaxane). Specific examples of the crosslinking agent include isocyanate and cyanuric chloride.

The proportion of the respective components in the resin composition is not particularly limited as long as the fiber sheet can acquire advantageous effects of the present invention. However, for example, in a case where the resin composition contains all of the component (A), the component (B), and the component (C), assuming a total amount of the component (A), the component (B), and the component (C) as 100 parts by mass, amounts of the respective components become as follows. The amount of polyrotaxane (A) is about 10 to 80 parts by mass, and more preferably about 30 to 50 parts by mass. The amount of the thermosetting resin (B) is 10 to 89.9 parts by mass, and more preferably 30 to 50 parts by mass. The amount of the curing agent (C) is about 0.1 to 30 parts by mass, more preferably about 0.1 to 20 parts by mass. In a case where the resin composition according to the present embodiment contains an isocyanate resin as a crosslinking agent, 0 to 50 parts by mass of the isocyanate resin can be added to polyrotaxane (A). More preferably, 10 to 40 parts by mass of the isocyanate resin is added to polyrotaxane (A). In a case where the resin composition contains the component (B) and the component (C) and does not contain the component (A), assuming a total amount of the resin composition as 100 parts by mass, an amount of the thermosetting resin (B) is about 50 to 99 parts by mass, more preferably about 60 to 80 parts by mass, and an amount of the curing agent (C) is about 1 to 50 parts by mass, more preferably about 1 to 40 parts by mass.

Furthermore, the resin composition according to the present embodiment may contain other additives, for example, a curing catalyst (curing accelerator), a flame retardant, a flame retardant aid, a leveling agent, a coloring agent, and the like when necessary as long as the advantageous effects of the present invention are not impaired.

A method for preparing the resin composition according to the present embodiment is not particularly limited. For example, the resin composition according to the present embodiment can be obtained by firstly mixing an epoxy resin, a curing agent, a crosslinking agent, a thermosetting resin, and a solvent such that these compositions are uniformly mixed. The solvent used in preparing the resin composition is not particularly limited. For example, toluene, xylene, methyl ethyl ketone, acetone, and the like can be used. With respects to these solvents, one solvent may be used alone or two or more kinds of solvents can be used in combination. If necessary, an organic solvent for adjusting the viscosity or various additives may be blended.

In the fiber sheet according to the present embodiment, the resin layer is formed by, for example, immersing a fiber layer described later in the resin composition described above, applying the resin composition to the fiber layer, or laminating the film-shaped resin composition to the fiber layer. The method for applying the resin composition is not particularly limited. Examples of the coating method include a method which uses a bar coater, a method which uses a comma coater, a method which uses a die coater, a method which uses a roll coater, and a method which uses a gravure coater.

In a case where the fiber layer is impregnated with the resin layer, the impregnation can be repeated a plurality of times when necessary. In this case, it is also possible to repeat the impregnation using a plurality of resin varnishes having different compositions and concentration. By performing such impregnation, it is possible to finally adjust the composition and the resin amount of the fiber layer to a desired composition and resin amount.

After the resin varnish is applied to the fiber layer or after the fiber layer is impregnated with the resin varnish, an organic solvent is volatilized from the resin layer (A stage) which contains the resin composition before curing, containing the organic solvent by heating. As a result, the organic solvent can be reduced or removed from the resin layer. By heating the fiber layer applied with or impregnated with the resin composition (resin varnish) under desired heating conditions, for example, at a temperature of 80° C. to 120° C. for 1 minute to 120 minutes, a resin layer in an uncured state or a semi-cured state (stage B) in which the organic solvent is reduced or removed is obtained. In the embodiment of the present invention, the B-stage of the resin composition, that is, the uncured state (uncured product) or the semi-cured state (semi-cured product) is a state in which the resin composition can be further cured. For example, when the resin composition is heated, the viscosity of the resin composition is gradually lowered at first and, then, curing of the resin composition starts so that the viscosity of the resin composition is gradually increased. In such a case, examples of the semi-curing state include a state between a point of time that the increase of viscosity is started to a point of time before the resin composition is completely cured.

By further heating the fiber layer, the resin layer can be cured. By heating the fiber layer applied with or impregnated with the resin composition (resin varnish) under desired heating conditions, for example, at a temperature of 80° C. to 200° C. for 1 minute to 120 minutes, a resin layer in a cured state (C-stage) is obtained. In the present embodiment, the C stage of the resin composition, that is, the cured state (cured product) refers to a state where a curing reaction progresses and crosslinking of the resin occurs so that the resin is not melted even when the resin is heated.

In a case where the film-shaped resin composition is laminated to a fiber layer, for example, by applying the resin composition to a desired plastic film, metal foil or the like in advance, a resin layer containing a resin composition before curing (stage A) which contains an organic solvent is obtained. Further, by heating the resin layer under a desired heating condition, for example, at 80° C. to 120° C. for 1 minute to 120 minutes, a resin layer in an uncured state or a semi-cured state (stage B) is obtained. Such a structure can be obtained by laminating the resin composition to the fiber layer and by fixing the resin composition to the fiber layer using external energy such as pressure and heat. The resin layer may be in an uncured state or a semi-cured state (stage B), or may be in a cured state (stage C) by further curing the resin layer by heating.

(Fiber Layer)

The fiber layer according to the present embodiment is not particularly limited. However, for example, a fiber layer formed of a woven fabric, a knitted fabric, a braided fabric, a nonwoven fabric, or a combination of these fabrics can be used. The fiber layer may be a woven fabric arranged in one direction. With the use of such a fiber layer, it is possible to obtain a fiber sheet having stretchability only in a desired direction.

In the fiber layer, the woven fabric, the knitted fabric, the braided fabric, the nonwoven fabric, or the like described above is preferably formed of plant fibers, animal fibers, synthetic fibers, semi-synthetic fibers, regenerated fibers, inorganic fibers, or a combination of these fibers.

Since it is desirable that the fiber sheet according to the present embodiment have stretchability, it is desirable that the fiber layer also have a certain degree of stretchability or elongation property. Specifically, the fiber layer may be a fiber layer in which the initial tensile elastic modulus of the fiber sheet is 1 MPa or more and 1 GPa or less. For example, the elastic modulus of the fiber layer is preferably about 0.01 MPa to 1 GPa. The elongation rate is preferably about 1% or more and 1000% or less, and more preferably 5% or more and 1000% or less. That is, the fiber layer of the present embodiment does not include a base material such as a glass cloth having substantially no elongation property.

More specifically, examples of the fiber used in the fiber layer according to the present embodiment include fibers which are generally used as a fabric. That is, examples of the plant fibers include seed hair fibers such as cotton and kapok, bark fibers such as flax, timer, choma, jute, mitsumata, and kozo, and leaf vein fibers such as Manila hemp and sisal hemp. Examples of the animal fibers include wool, angora, cashmere, mohair, camel, alpaca, and silk. The animal fibers may include leathers. Examples of leathers include leathers of mammals such as cow, pig, horse, sheep, and goat, leathers of reptiles such as crocodile and snake, leathers of birds such as ostrich, and leathers of fishes such as sharks. Examples of the synthetic fibers include nylon fibers, aramid fibers, vinylon fibers, polyvinylidene chloride-based synthetic fibers, polyvinyl chloride-based synthetic fibers, polyester-based synthetic fibers, polyacrylonitrile-based synthetic fibers, polyethylene-based synthetic fibers, polypropylene-based synthetic fibers, polyurethane-based synthetic fibers, and polylactic acid fibers. The synthetic fibers may include artificial leather and synthetic leather. Examples of the semi-synthetic fibers include acetate fibers. Examples of the regenerated fibers include viscose fibers and copper ammonia fibers Examples of the inorganic fibers include glass fibers, carbon fibers, and metal fibers.

For example, when used for a wearable device, as the fiber of the fiber layer, a fabric used for clothing can also be used. Alternatively, for example, the fabric may be a fabric used for a tent, a truck bed, or the like. Accordingly, with the fabrics used in various scenes, it is also possible to integrate the fabrics and various devices.

In the fiber sheet according to the present embodiment, the thickness of the fiber layer is not particularly limited, and can be appropriately set depending on the application. For example, it is preferable that the thickness of the fiber layer fall within a range from 50 μm to 5000 μm from a viewpoint of stretchability and handling property.

(Conductor Layer)

Furthermore, the fiber sheet according to the present embodiment may include a conductor layer on one surface, both surfaces, or in the fiber sheet. Examples of the conductor layer include wiring formed of a metal foil or a conductive composition, an extremely thin coated conductor layer, a conductive yarn, and a metal molded product.

Metal Foil

The metal foil is not particularly limited. Examples of the metal foil include a copper foil (plating), an aluminum foil, and a stainless steel foil. These metal foils may be metal foils whose surfaces are treated with a silane coupling agent or the like.

In a case of forming the conductor layer using the metal foil, one or a plurality of the above-mentioned fiber sheets are laminated, and a metal foil such as a copper foil is further laminated on a part or the entirety of upper and lower surfaces or one surface of the laminated fiber sheets, and these sheets and metal foils are integrally laminated by heat and pressure molding so that a laminate having both surfaces cladded with a metal foil or a laminate having one surface cladded with a metal foil can be produced. Alternatively, one or a plurality of fiber sheets are laminated, and a metal foil such as a copper foil coated with a resin layer is further laminated on a part or the entirety of upper and lower surfaces or one surface of the laminated fiber sheets, and these sheets and metal foils are integrally laminated by heat and pressure molding so that a laminate having both surfaces cladded with a metal foil or a laminate having one surface cladded with a metal foil can be prepared. Alternatively, one or a plurality of fiber layers not including a resin layer are laminated, and a laminate obtained by applying a resin layer to a metal foil such as a copper foil is further laminated on both upper and lower surfaces or a part or the entire surface of one surface of the fiber layers, and the laminated fiber layers are integrally laminated by heat press molding so that a laminate having both surfaces cladded with a metal foil or a laminate having one surface cladded with a metal foil can be prepared. Then, a circuit (wiring) is formed by applying etching or the like to the metal foil. As a result, a conductor layer (wiring) can be disposed as a circuit on the surface of the laminate which includes the fiber sheet according to the present embodiment. In a case where a circuit is formed by etching the metal foil, masking is preferably performed so that the fiber layer is not immersed in the etching solution. For example, the conductor layer can be prepared by the following procedure. As a cover film, for example, a solvent-resistant plastic film such as polyimide is provided. An opening having a desired shape is formed in the solvent-resistant plastic film. A resin layer having one surface to which a metal foil is cladded is laminated to the solvent-resistant plastic film so that the resin layer covers the opening. The resin layer and the fiber layer are integrally laminated to each other by heat and pressure molding. In this case, the fiber layer is impregnated with the resin layer only through the opening portion. To prevent the fiber layer from being in contact with an etching solution, etching processing is performed while making the laminate adhere to a plastic plate using a tape or the like. Finally, by cutting and removing the cover film along a boundary of the opening, the resin layer is formed in the shape of the above-mentioned opening, and a circuit formed of the metal foil is formed on the surface of the resin layer.

Examples of a method for forming a circuit include, in addition to the above-mentioned circuit forming method, a semi-additive process (SAP) or a modified semi-additive process (MSAP). Furthermore, a laminate including a conductor layer can be produced by laminating using a resin layer in an uncured state or a semi-cured state, or a fiber sheet which includes such a resin layer.

In a case where a copper foil is further used as a conductor layer in the fiber sheet according to the present embodiment, the fiber sheet has heat resistance and also has favorable solder wettability. Accordingly, components can be mounted on the fiber sheet by a reflow process and hence, it is possible to provide a fabric device or the like having high operation reliability. Further, components can be mounted on both surfaces of the fiber sheet by various means, or the mounted components can be further embraced in the fiber sheet.

Conductive Composition

The conductor layer according to the present embodiment may be formed of a conductive composition.

The conductive composition according to the present embodiment is preferably a conductive composition having stretchability. As a result, it is possible to obtain a fabric device or the like which does not inhibit elongation property and stretchability of the fiber sheet and has excellent operation reliability. Hereinafter, an example of the conductive composition having stretchability will be specifically described.

Specific examples of the conductive composition include the following resin composition. The resin composition contains: a resin (D) that becomes a stretchable binder; a curing agent (E) that reacts with the resin (D); and a conductive filler (F). The resin (D) has a functional group having a functional group equivalent of 400 g/eq or more and 10,000 g/eq or less. A cured product of the resin (D) and the conductive composition has a glass transition temperature (Tg) or a softening point of 40° C. or less, and has an elastic modulus of less than 1.0 GPa at a temperature of 30° C. The conductive filler (F) is formed of a conductive substance having an intrinsic volume resistivity of $1 \times 10^{-4}$ Ω·cm or less at a room temperature. Examples of the functional group include an epoxy group, a vinyl group, a (meth) acryloyl group, a hydroxyl group, a carboxyl group, an amino group, an alkoxy group, and a carbonyl group.

The respective components will be described hereinafter.

With respect to the constituent elements of the molecular structure of the resin (D), the molecular structure may be formed of a single constituent element, or may be formed of plural kinds of constituent elements contained in combination at an arbitrary ratio. The molecular structure of the resin (D) is preferably a molecular structure containing at least one selected from a group consisting of (meth) acrylic acid ester, styrene, and nitrile as a constituent element. As specific examples, epoxy-modified (meth) acrylic acid ester, hydroxyl group-modified (meth) acrylic acid ester, carboxyl group-modified (meth) acrylic acid ester, and the like are preferably exemplified.

according to the present embodiment, the resin (D) preferably has a weight average molecular weight of 50,000 or more. Accordingly, it is considered that in a case where a conductive pattern is printed using the conductive composition according to the present embodiment or the like, it is considered that blurring in printing hardly occurs. On the other hand, an upper limit value of the weight average molecular weight is not particularly limited. However, in a case where the molecular weight exceeds 3 million, the viscosity is increased so that the handling property may be deteriorated. Accordingly, the weight average molecular weight range of the resin (D) is preferably 50,000 or more and 3 million or less, and more preferably 100,000 or more and 1 million or less.

As the curing agent (E), various curing agents can be used without particular limitation as long as the curing agent (E) has reactivity with the resin (D) as described above. Specific examples of the curing agent (E) include radical generators such as imidazole-based compounds, amine-based compounds, phenol-based compounds, acid anhydride-based compounds, isocyanate-based compounds, mercapto-based compounds, onium salts, and peroxides, and photoacid generators.

The conductive filler (F) is made of a conductive material having an intrinsic volume resistivity of $1\times10^{-4}$ Ω·cm or less at a room temperature. In a case where a material having an intrinsic volume resistivity of more than $1\times10^{-4}$ Ω·cm at a room temperature is used, the volume resistivity of the conductive composition is about $1\times10^{-3}$ Ω·cm to $1\times10^{-2}$ Ω·cm although it depends on a blending amount when the conductive composition is produced. Therefore, when a circuit is formed using the conductive composition, a resistance value of the circuit is increased so that a loss of power is increased.

Examples of the conductive material (the conductive material having an intrinsic volume resistivity of $1\times10^{-4}$ Ω·cm or less at a room temperature) include a single component formed of a metal element such as silver, copper or gold, and compounds such as oxides, nitrides, carbides, and alloys containing these elements. In addition to the conductive filler (F), a conductive or semiconductive conductive auxiliary agent can be added to the conductive composition for the purpose of further improving conductivity. As such a conductive or semiconductive auxiliary agent, a conductive polymer, an ionic liquid, carbon black, acetylene black, a carbon nanotube, an inorganic compound used for an antistatic agent, and the like can be used. One kind of auxiliary agent may be used, or two or more kinds of auxiliary agents may be simultaneously used.

The shape of the conductive filler (F) is preferably a flat shape, and an aspect ratio between a thickness and a size in an in-plane longitudinal direction is preferably 10 or more. When the aspect ratio is 10 or more, it is also possible to acquire an advantageous effect that not only a surface area with respect to a mass ratio of the conductive filler increases and the conductivity efficiency increases, but also the adhesion of the conductive filler with the resin component is improved so that the stretchability of the fiber sheet is improved. From a viewpoint that better conductivity and printability can be secured when the aspect ratio is 1000 or less, the aspect ratio is preferably 10 or more and 1000 or less, and is more preferably 20 or more and 500 or less. Examples of the conductive filler having such an aspect ratio include a conductive filler having a tapped density of 6.0 g/cm³ or less as measured by a tap method. Furthermore, when the tapped density is 2.0 g/cm³ or less, the aspect ratio is further increased. Accordingly, such tapped density is more preferable.

With respect to a proportion of the conductive filler (F) in the conductive composition, in terms of conductivity, cost, and printability, the proportion of the conductive filler (F) is preferably 40 to 95% by mass, and is more preferably 60 to 85% by mass with respect to a total amount of the conductive composition.

A particle size of the conductive filler (F) of the present embodiment is not particularly limited. However, from a viewpoint that proper printing property is obtained during screen printing and proper viscosity is obtained in mixing of blending materials, an average particle size (a particle size at volume accumulation of 50%; D50) measured by a laser light scattering method is preferably 0.5 μm or more and 30 μm or less, and is more preferably 1.5 μm or more and 20 μm or less.

Furthermore, according to the present embodiment, the conductive filler (F) is preferably a conductive filler whose surface is subjected to a coupling treatment. Alternatively, the conductive composition according to the present embodiment may contain a coupling agent. With such configurations, an advantageous effect is acquired that the adhesion between the binder resin and the conductive filler is further improved.

The coupling agent which is added to the conductive composition or is used for applying coupling treatment to the conductive filler can be used without particular limitation as long as the coupling agent is adsorbed in the filler surface or reacts with the filler surface. Specific examples of the coupling agent include a silane coupling agent, a titanate-based coupling agent, and an aluminum-based coupling agent.

In a case where a coupling agent is used in the present embodiment, an addition amount of the coupling agent is preferably about 1% by mass to 20% by mass with respect to the entirety of the conductive composition.

Proportions

The proportions of respective components in the conductive composition are not particularly limited as long as the fiber sheet can exhibit advantageous effects of the present invention. The proportions of the resin (F) and the curing agent (G) can be appropriately determined in consideration of an equivalent ratio or the like depending on a kind of the resin and a kind of the curing agent.

In addition to the above components, additives or the like can be added to the conductive composition according to the purpose. Examples of the additives include elastomers, surfactants, dispersants, colorants, fragrances, plasticizers, pH adjusters, viscosity adjusters, ultraviolet absorbers, antioxidants, and lubricants.

The method for preparing the conductive composition is not particularly limited as long as the conductive composition can be produced. Examples of the method for preparing the conductive composition include a method of obtaining the conductive composition by uniformly mixing and stirring the resin component and the conductive filler described above, and when necessary, a curing agent, a dispersant and the like, and a solvent. The mixing and stirring method is not particularly limited. A highly shearing and dispersing device such as a rotation-revolution mixer or a three-roll mill is preferably used. Further, vacuum degassing may be performed.

Conductor Layer Using Conductive Composition

By applying or printing the conductive composition according to the present embodiment on the resin layer of the fiber sheet as described above, a coating film made of the conductive composition can be formed so that a conductor layer such as a desired wiring (conductive pattern) can be formed.

The conductive pattern and the like by the wiring can be formed on the surface of the fiber sheet in accordance with the following steps. That is, first, a coating film is formed by applying or printing the conductive composition according to the present embodiment on the resin layer, and a volatile component contained in the coating film is removed by drying. A conductive pattern by stretchable wiring can be formed by performing: a step of curing the resin (D) and the curing agent (F) by a subsequent curing step such as heating or irradiation of electron beams or light; and a step of generating a reaction between the coupling agent and the conductive filler (F) and a reaction between the resin (D) and the curing agent (F). The conditions in the curing step and the reaction step are not particularly limited, and may be appropriately set according to the type or desired form of the resin, the curing agent, the filler, and the like.

The step of applying the conductive composition of the present embodiment onto the substrate is not particularly limited. However, for example, a coating method which uses an applicator, a wire bar, a comma roll, or a gravure roll, or a printing method which uses a screen, a flat plate offset, a flexo, an inkjet, a stamping, a dispense, a squeegee, or the like can be used.

Figure 5:
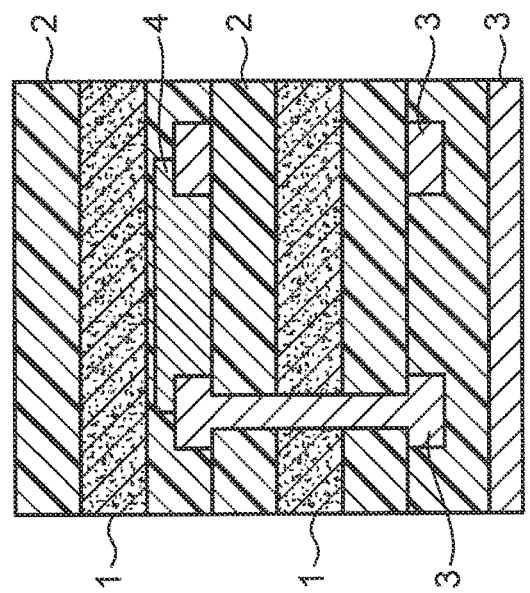
FIG. 5 is a schematic cross-sectional view of an example of a fiber sheet according to an embodiment of the present invention in which a conductor layer is also formed in the fiber sheet.
Figure 5:
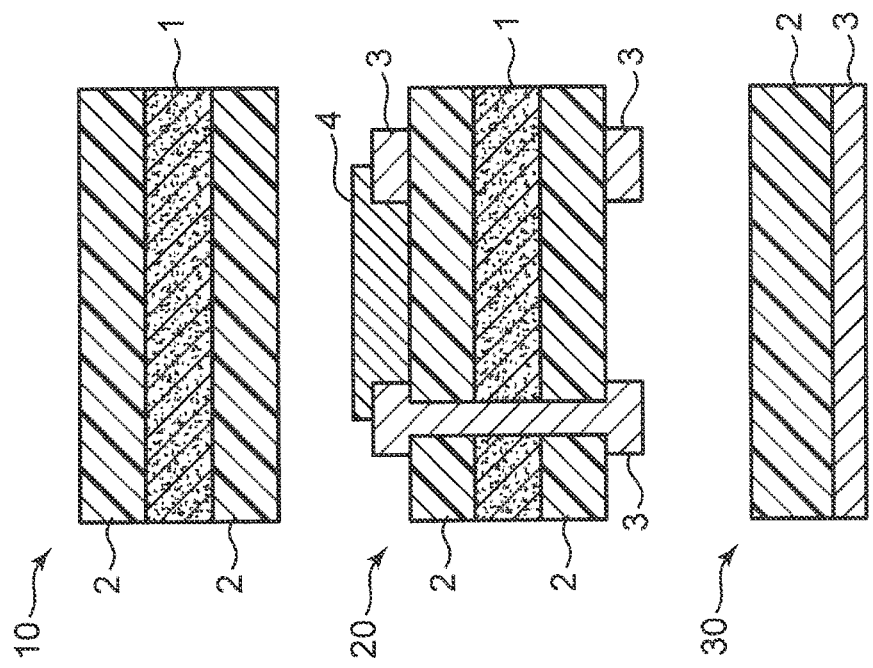
Figure 6A:
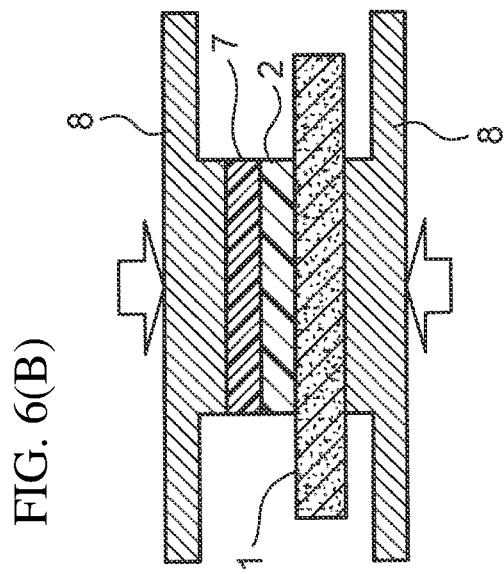
FIGS. 6(A), 6(B), 6(C), and 6(D) are schematic cross-sectional views illustrating a process for producing a fiber sheet in an example.
Figure 6B:
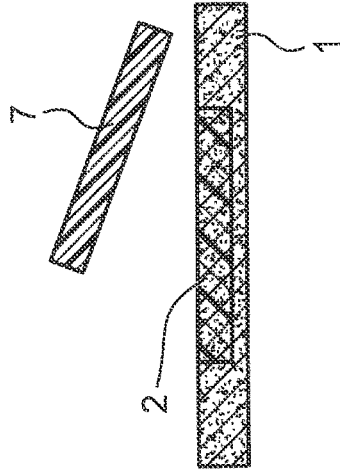
Figure 6C:
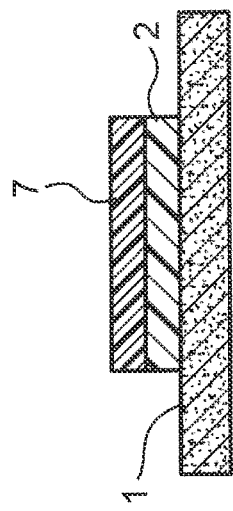
Figure 6D:
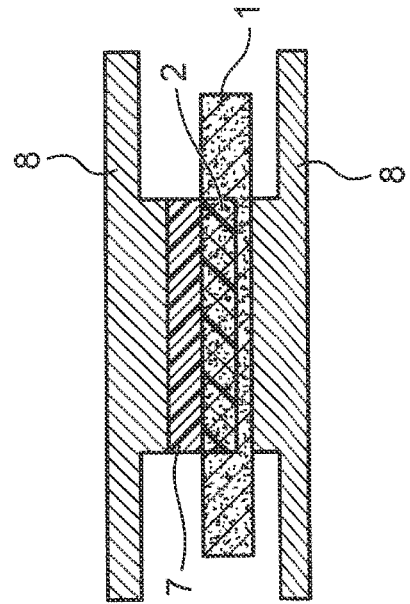
Figure 7A:
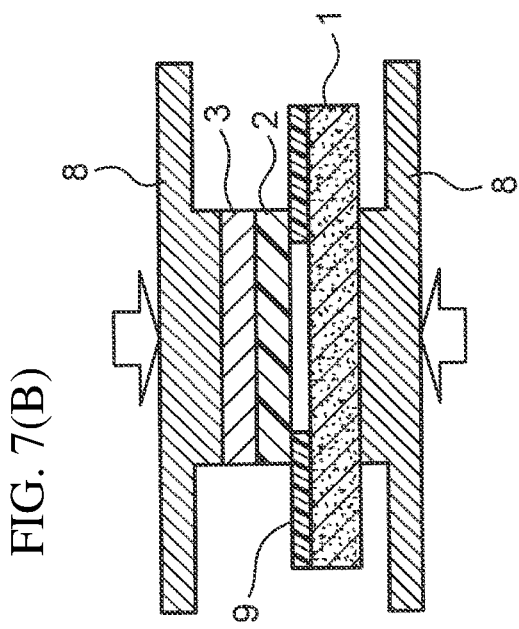
FIGS. 7(A), 7(B), 7(C), and 7(D) are schematic cross-sectional views illustrating a process for producing a fiber sheet with a copper foil in the example.
Figure 7B:
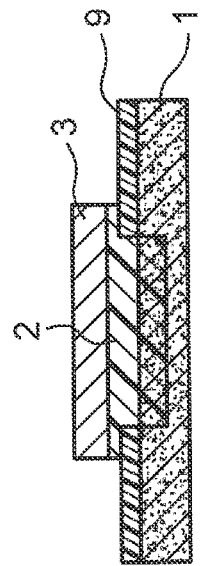
Figure 7C:
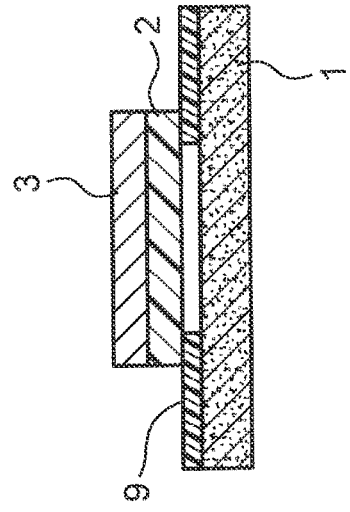
Figure 7D:
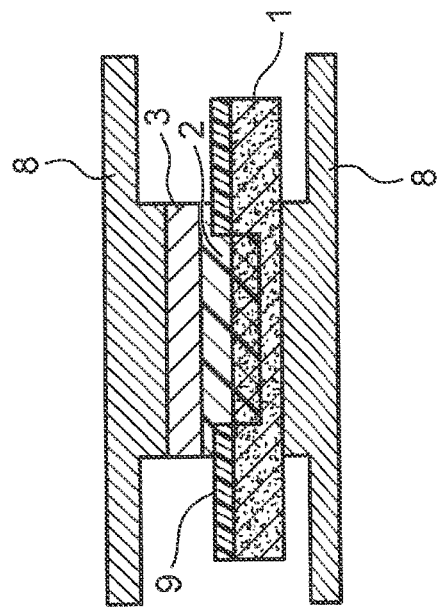

Furthermore, the conductor layer may be formed in the fiber sheet. In this case, after a conductive pattern is formed by the means described above, for example, as illustrated in FIG. 5, an uncured or semi-cured resin layer, a fiber sheet 10 containing the resin layer, a resin layer (insulating layer) 30 including a conductor layer, and the like are laminated on the fiber sheet 20 on which the conductive pattern is formed, and the fiber sheet 20 and these layers are integrally laminated by heat press molding, whereby the stretchable wiring can be formed in the fiber sheet.

Conductor Layers Other than the Above-Mentioned Conductor Layer

The conductor layer or the wiring may be formed by applying or printing a material produced by dispersing a conductive filler, a conductive polymer, an ionic liquid, carbon black, acetylene black, carbon nanotubes, an inorganic compound used for an antistatic agent, and the like in a solvent or metal in a liquid form onto both surfaces, a portion of one surface, or the entire surface of the fiber sheet. A plurality of conductor layers may be connected by sewing the conductor layers using a conductive yarn. The plurality of conductor layers may be connected by molded metal products such as rivets or snap buttons.

<Laminate, Circuit Board, and Electronic Board>

The laminate according to the present embodiment is formed by laminating two or more fiber sheets (the fiber sheet including the conductor layer or the fiber sheet not including the conductor layer).

In the case described above where two or more sheets including the conductor layer are laminated as the fiber sheet, there may be a case where the laminate includes the plurality of conductor layers. In this case, the plurality of conductor layers may be electrically connected to each other by plating (a metal foil such as a copper foil) described above, the conductive composition described above or the like. The conductive composition used for conduction preferably does not contain a solvent. Such a configuration brings about an advantageous effect that the conductive composition can be used as a multilayer circuit board.

Further, the circuit board according to the present embodiment is characterized by using the fiber sheet which includes the conductor layer described above or the laminate described above.

Still furthermore, the present invention also embraces an electronic board which includes the fiber sheet described above or the laminate described above, and electronic components.

Figure 4:
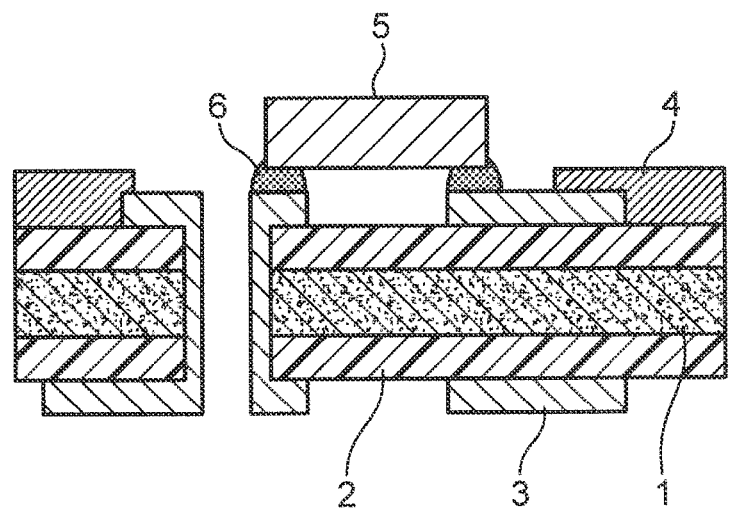
FIG. 4 is a schematic cross-sectional view illustrating a configuration of an electronic board according to an embodiment of the present invention.

The configuration or the mode of the electronic board is not particularly limited. However, as an example, with respect to an electronic board illustrated in FIG. 4, the resin layer 2 is formed on both surfaces of the fiber layer 1, and a circuit is formed on a surface of the resin layer 2 or in the fiber sheet by the metal foil (copper foil) 3. Further, the circuit formed of the metal foil 3 and the circuit formed of the metal foil 3 are electrically connected to each other by a conductive composition 4, and an electronic component is mounted on the circuit via a solder 6.

The circuit board and the electronic board according to the present embodiment can be manufactured by a known method using the above-described fiber sheet and the above-described laminate. The fiber sheet according to the present embodiment has heat resistance and hence, it is possible to mount electronic components on the fiber sheet by a reflow method as described above. Furthermore, in addition to a reflow method, various heating means such as welding, soldering iron, induction heating, and microwaves can be used. Even if a means which can locally heat the resin layer is used, the resin layer has heat resistance and hence, neither melting nor thermal decomposition occurs in the resin layer. It is also possible to mount electronic components by an ACF or the like.

Further, it is also possible to manufacture a circuit board or an electronic board by forming elements using various printing techniques, for example, without using conventional electronic components. Even when a heating process is required in the step of producing the circuit board or the electronic board, since the resin layer has heat resistance, neither melting nor thermal decomposition occurs in the resin layer.

The laminate, the circuit board or the electronic board including an electronic component according to the present embodiment which has such a conductor layer are flexible and have both stretchability and bendability. Accordingly, the laminate, the circuit board, and the electronic board according to the present embodiment are extremely suitable as electronic members used for, for example, a bendable electronic paper, an organic EL display, a solar cell, an RFID, a pressure sensor, and the like.

Further, there is an integrity between the fiber layer that is a fabric (a cloth or the like) and the electronic device and hence, these components are also excellent as parts for producing a wearable device, and are also suitable for applications such as outdoor advertisement.

The present specification discloses technical features of various modes as described above, and the main technical features are recapitulated below.

The fiber sheet according to one aspect of the present invention is characterized in that the fiber sheet includes the resin layer containing the thermosetting resin and the fiber layer, and an initial tensile elastic modulus of the fiber sheet is 1 MPa or more and 1 GPa or less. With such a configuration, it is possible to provide a fiber sheet having a resin layer excellent in heat resistance and stretchability, which can be used for various applications.

In the above-mentioned fiber sheet, the thermosetting resin preferably contains at least an epoxy resin. In this case, it is considered that the fiber sheet can acquire higher heat resistance.

In the above-mentioned fiber sheet, a glass transition temperature of the thermosetting resin is preferably 60° C. or lower. With such a configuration, further flexibility can be imparted to the fiber sheet.

In the above-mentioned fiber sheet, the fiber layer is preferably formed of a woven fabric, a knitted fabric, a braided fabric, a nonwoven fabric, or a combination of these materials.

Furthermore, the above-mentioned fiber layer is preferably a woven fabric arranged in one direction. Such a configuration brings about an advantageous effect that a fiber sheet having stretchability only in a desired direction can be obtained.

It is also preferable that the fiber layer is formed of plant fibers, animal fibers, synthetic fibers, semi-synthetic fibers, regenerated fibers, inorganic fibers, or a combination of these fibers. As a result, the resin fiber has an advantage that the resin fiber is inexpensive and easily available, and at the same time, the resin fiber is generally used as a fabric and hence, the resin fiber can be used as a fabric device without giving a user a discomfort.

Hereinafter, the present invention will be described more specifically with reference to an example. However, the scope of the present invention is not limited by the example.

Example

First, various materials used in this example are as follows.
(Polyrotaxane)
  "SH 3400 P" (PEG as an axial molecule, α-cyclodextrin as a cyclic molecule, and OH group as a reactive group) manufactured by Advanced Soft Materials Co., Ltd., wherein hydroxyl value is 72 mg KOH/g, and hydroxyl equivalent is 779.
(Epoxy Resin)
  "JER1003" manufactured by Mitsubishi Chemical Corporation, wherein molecular weight is 1300, and epoxy equivalent is 650
  "PMS-14-29 EK30" manufactured by Nagase ChemteX Corporation, wherein molecular weight is 200000, and epoxy equivalent is 4762
(Curing Agent)
  "YH-307" manufactured by Mitsubishi Chemical Corporation, wherein acid anhydride equivalent is 231
  "D2000" manufactured by Mitsui Fine Chemicals, Inc., wherein amine equivalent is 1000
(Curing Accelerator)
  "2E4MZ" (2-ethyl-4 methylimidazole) manufactured by Shikoku Chemicals Corporation
(Acrylic Resin)
  "LA2250" (thermoplastic resin) manufactured by Kuraray Co., Ltd.
(Fiber Layer)
  Polyester fabric (Ponte Double Knit PDRR-002)
  Nylon fabric (Rayon Spandex Jersey Knit 0451725)
  Cotton fabric (Telio Organic Cotton Jersey Knit 0462839)
  Wool fabric (Wool Novelty Suiting 0649007)
  Acetate fabric (A8700)
  Cupra fabric (LOISIR AK 650)
  Paper (OK Clean RN)
  Cow leather
  Artificial leather (Roel II)
  Carbon fiber fabric (KRECA cloth P-200)

<Method for Producing Semi-Cured Resin Films>

Resin varnishes 1 to 5 were prepared by mixing the respective components in accordance with the proportions shown in Table 1. After performing degassing in a stationary state, the resin varnishes were applied to PET films (SP-PET 01 manufactured by Mitsui Chemicals Tohcello, Inc.) using a bar coater. Subsequently, the films were heated in an oven at a temperature of 80° C. for 24 hours and were further heated at a temperature of 160° C. for 5 minutes to obtain semi-cured resin films.

TABLE 1

|  |  | Resin varnish 1 | Resin varnish 2 | Resin varnish 3 | Resin varnish 4 | Resin varnish 5 |
|---|---|---|---|---|---|---|
| Polyrotaxane | SH3400P | 24.88 |  |  |  |  |
| Epoxy resin | JER1003 | 18.35 | 27.98 |  | 36.52 |  |
|  | PMS-14-29EK30 |  |  | 94.42 |  |  |
| Curing agent | YH-307 | 6.52 |  | 1.37 | 12.98 |  |
|  | D200 |  | 24.52 |  |  |  |
| Curing accelerator | 2E4MZ | 0.25 | 0.50 | 0.30 | 0.50 |  |
| Acrylic resin | LA2250 |  |  |  |  | 30.00 |
| Solvent | MEK/toluene (mass ratio 4/6) | 50.00 | 50.00 | 3.91 | 50.00 | 70.00 |
|  | Solid content ratio | 50.0 | 50.0 | 30.0 | 50.0 | 30.0 |

<Method for Producing Cured Resin Films>

Subsequently, the semi-cured resin films obtained from the resin varnishes 1 to 5 were further heated at a temperature of 160° C. for 1 hour to obtain cured resin films 1 to 5 shown in Table

TABLE 2

|  | Cured resin film 1 | Cured resin film 2 | Cured resin film 3 | Cured resin film 4 | Cured resin film 5 |
|---|---|---|---|---|---|
| Film thickness [μm] | 105 | 112 | 88 | 98 | 91 |
| Initial tensile elastic modulus [Mpa] | 4.1 | 51.0 | 0.3 | 381.4 | 1.5 |
| Glass transition temperature [° C.] | 44.3 | 56.5 | 5.0 | 127.8 | −24.2 |

<Method for Producing Copper Foils with Semi-Cured Resin>

The resin varnishes were applied to a copper foil (CF-T9DA-SV-18 manufactured by Fukuda Metal Foil & Powder Co., Ltd.) using a bar coater. Then, the varnish applied copper foils were heated in an oven at a temperature of 80° C. for 24 hours and were further heated at a temperature of 160° C. for 5 minutes to obtain the copper foils with a semi-cured resin.

<Method for Producing Copper Foils with Cured Resin>

The copper foils with a semi-cured resin were further heated at a temperature of 160° C. for 1 hour to obtain the copper foils with a cured resin.

<Method for Producing Fiber Sheet>

As illustrated in FIGS. 6(A), 6(B), 6(C), and 6(D), first, a semi-cured resin film or a cured resin film cut into 100 mm square was placed as a resin layer 2 at the center of a fiber layer 1 (polyester fabric (Ponte Double Knit PDRR-002)) cut into 300 mm square while a PET film 7 was attached as a support, and the fiber layer 1 was sandwiched by stainless steel plates 8. The fiber layer 1 sandwiched by the stainless steel plates 8 was set in a vacuum heating press machine (manufactured by SHINTO METAL INDUSTRY CO., LTD., ASFV-25), and was heated at a temperature of 160° C. for 1 hour under a pressure of 1 MPa. Then, the PET film 7 was peeled off so that a fiber sheet which includes the fiber layer 1 and the resin layer 2 was obtained.

<Method for Producing Circuit Board 1>

A silver paste was printed on a resin layer surface of the fiber sheet using a screen plate to form a wiring made of the silver paste on the resin layer of the fiber sheet. As a result, a circuit board 1 was obtained.

<Method for Producing Fiber Sheet with Copper Foil>

As illustrated in FIGS. 7(A), 7(B), 7(C), and 7(D), a polyimide film 9 (Upilex S manufactured by Ube Industries, Ltd., 25 μm) was cut into 300 mm square, and a 100 mm square film was cut out from a central portion of the polyimide film 9. Next, the polyimide film 9 was placed on a fiber layer 1 cut into 300 mm square, and a laminate, which is obtained by placing a copper foil with a semi-cured resin or a copper foil with a cured resin, which was cut into 150 mm square so as to cover the cut portion of a 100 mm square film of the polyimide film 9 and includes a resin layer 2 and a conductor layer (copper foil) 3 on the polyimide film 9 in a direction in which the resin layer 2 is on a polyimide film side, was sandwiched between two stainless plates 8. The laminate was set in a vacuum heating press machine (manufactured by SHINTO METAL INDUSTRY CO., LTD., ASFV-25), and was heated at a temperature of 160° C. for 1 hour under a pressure of 1 MPa. As a result, a fiber sheet with a copper foil was obtained.

<Method for Producing Circuit Board 2>

Figure 8A:
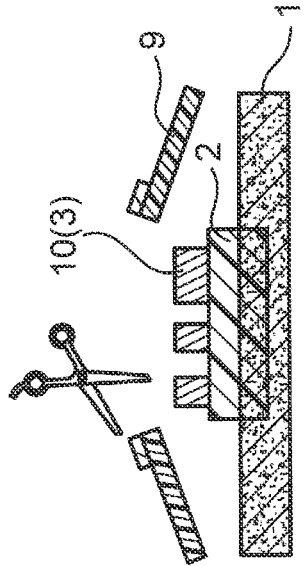
FIGS. 8(A) and 8(B) are schematic cross-sectional views illustrating a producing process of a circuit board 2 in the example.
Figure 8B:
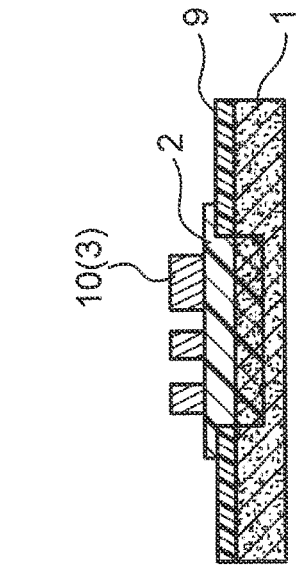

As illustrated in FIG. 8(A) and 8(B), a dry film resist was laminated on a copper foil surface of a fiber sheet with a copper foil, and development and copper foil etching were performed by photolithography so as to form wiring 10 formed of conductor layer (copper foil) 3 on a resin layer of the fiber sheet with the copper foil. Then, the polyimide film 9 was removed. As a result, a circuit board 2 was obtained.

<Method for Measuring Initial Tensile Elastic Modulus of Cured Resin Film>

The initial tensile elastic moduli of the respective cured resin films 1 to 5 shown in Table 2 were measured. Specifically, each cured resin film was cut into a dumbbell No. 6 (JIS K 6251) and was mounted on a universal testing machine (AGS-X manufactured by Shimadzu Corporation). The test was performed at a tensile speed of 25 mm/min, and a gradient of r-σ was obtained from all stress (σ) data corresponding to strains (r) of 0 to 0.01 using a least square method to calculate the initial tensile elastic modulus. The result is shown in Table 2 above.

Strain($r$)=$x/x0$ ($x$ being a movement distance of a gripper, and $x0$ being a distance between initial grippers.)

Stress ($\sigma$)=$F/(d \cdot l)$ ($F$ being a test force, $d$ being a film thickness, and $l$ being a width of a test piece.)

<Method for Measuring Glass Transition Temperature of Cured Resin Film>

The cured resin film was cut into 10 mm*30 mm, and was mounted on a dynamic viscoelasticity measuring device (DMS 6100 manufactured by Seiko Instruments Inc.). The test was performed at a strain amplitude of 10 μm, a frequency of 10 Hz (a sinusoidal wave), and a temperature elevation rate of 5° C./min, and a calculated peak temperature of tan δ was adopted as the glass transition temperature. The results are also summarized in Table 2 above.

<Method for Measuring Initial Tensile Elastic Modulus of Fiber Sheet>

As the fiber sheets, fiber sheets 1 to 16 were prepared by combining semi-cured or cured resin films 1 to 5 which were prepared by using the respective resin varnishes 1 to 5 in Table 1 and various fiber layers shown in Table 3.

Then, the respective obtained fiber sheets were cut into 50 mm*100 mm so that the entire surface of each fiber sheet includes the resin layer, and the fiber sheets were attached to a universal testing machine (AGS-X manufactured by Shimadzu Corporation). A test was performed at an initial distance between grippers of 50 mm and a tensile speed of 100 mm/min, and a gradient of r-σ was obtained from all stress (σ) data corresponding to strains (r) of 0 to 0.01 using a least square method to calculate an initial tensile elastic modulus. The result is shown in Table 3.

Strain($r$)=$x/x0$ ($x$ being a movement distance of a gripper, and $x0$ being a distance between initial grippers.)

Stress($\sigma$)=$F/(d \cdot l)$ ($F$ being a test force, $d$ being a film thickness, and $l$ being a width of a test piece.)

The measurement results of the fiber sheets 1 to 16 were the same also with respect to the fiber sheets with a copper foil prepared using the same resin layer and the same fiber layer.

TABLE 3

| | Example 1 | Example 2 | Example 3 | Example 4 | Example 5 | Example 6 | Example 7 | Example 8 | Example 9 | Example 10 | Example 11 | Example 12 | Example 13 | Example 14 | Example Comparative 1 | Example Comparative 2 |
|---|---|---|---|---|---|---|---|---|---|---|---|---|---|---|---|---|
| Fiber sheet | Fiber sheet 1 | Fiber sheet 2 | Fiber sheet 3 | Fiber sheet 4 | Fiber sheet 5 | Fiber sheet 6 | Fiber sheet 7 | Fiber sheet 8 | Fiber sheet 9 | Fiber sheet 10 | Fiber sheet 11 | Fiber sheet 12 | Fiber sheet 13 | Fiber sheet 14 | Fiber sheet 15 | Fiber sheet 16 |
| Fiber layer | Polyester fabric | Polyester fabric | Polyester fabric | Polyester fabric | Polyester fabric | Nylon fabric | Cotton fabric | Wool fabric | Acetate fabric | Cupla fabric | Paper | Cow leather | Artificial leather | Carbon fiber fabric | Polyester fabric | Polyester fabric |
| Resin layer | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 1 | Semi-cured resin film 4 | Semi-cured resin film 5 |
| One side/Both side | One side | One side | One side | One side | Both surfaces | One side | One side | One side | One side | One side | One side | One side | One side | One side | One side | One side |
| Sheet film Thickness [μm] | 451 | 464 | 431 | 539 | 466 | 394 | 445 | 357 | 150 | 139 | 177 | 5139 | 3556 | 2203 | 460 | 427 |

TABLE 3-continued

| | Example 1 | Example 2 | Example 3 | Example 4 | Example 5 | Example 6 | Example 7 | Example 8 | Example 9 | Example 10 | Example 11 | Example 12 | Example 13 | Example 14 | Example Comparative 1 | Example Comparative 2 |
|---|---|---|---|---|---|---|---|---|---|---|---|---|---|---|---|---|
| Initial tensile modulus [mpa] | 102.9 | 752.3 | 49.2 | 225.5 | 114.6 | 69.4 | 723.2 | 756.3 | 573.5 | 753.3 | 9545.1 | 639.4 | 492.4 | 390.5 | 11203.5 | 77.3 |

Summary of Examples

From Table 3, it was confirmed that the fiber sheets of Examples 1 to 14 according to the present invention all had an initial tensile elastic modulus of 1 MPa or more and 10 GPa or less. On the other hand, in Comparative Example 1, the initial tensile elastic modulus exceeded 10 GPa as shown in Table 3. The semi-cured resin film used in Comparative Example 1 had a glass transition temperature higher than 60° C. when formed into the cured film (see Table 2). Since the fiber sheet of Comparative Example 2 did not contain a thermosetting resin, component mounting by a reflow process resulted in defective mounting.

This application is based on Japanese Patent Application No. 2019-61650 filed on Mar. 27, 2019, the contents of which are included in the present application.

In order to express the present invention, the present invention has been appropriately and sufficiently described through the embodiments with reference to specific examples, drawings, and the like in the above. However, it should be recognized that a person skilled in the art can easily change and/or improve the above-described embodiments. Therefore, unless a change or improvement made by a person skilled in the art is at a level departing from the scope of rights of the claims described in the claims, the change or improvement is interpreted to be included in the scope of rights of the claims.

INDUSTRIAL APPLICABILITY

The fiber sheet of the present invention has wide industrial applicability in technical fields such as an optical field, an electronic field, an adhesion field, and a medical field, such as a wearable device, a patch device, and a flexible display device.

The invention claimed is:

1. A fiber sheet comprising:
   a resin layer consisting of a thermosetting resin and a curing agent; and
   a fiber layer,
   wherein
   the fiber sheet is stretchable by 1% or more,
   an initial tensile elastic modulus of the fiber sheet is 5 MPa or more and 10 GPa or less,
   the thickness of the resin layer is within a range of 50 μm to 5000 μm,
   a glass transition temperature of the thermosetting resin is 60° C. or lower, and
   at least a portion of at least one surface of the fiber layer is impregnated with the resin layer.

2. The fiber sheet according to claim 1, wherein the thermosetting resin contains at least an epoxy resin.

3. The fiber sheet according to claim 1, wherein the fiber layer is formed of a woven fabric, a knitted fabric, a braided fabric, a nonwoven fabric, or a combination of these fabrics.

4. The fiber sheet according to claim 1, wherein the fiber layer is formed of plant fibers, animal fibers, synthetic fibers, semi-synthetic fibers, regenerated fibers, inorganic fibers, or a combination of these fibers.

5. The fiber sheet according to claim 1, further comprising a conductor layer on one side or both sides of the fiber sheet.

6. A circuit board configured to use the fiber sheet according to claim 5.

7. The fiber sheet according to claim 1, further comprising a conductor layer disposed inside of the fiber sheet.

8. The fiber sheet according to claim 1, wherein a glass transition temperature of the resin layer is 60° C. or lower.

9. An electronic board comprising:
   the fiber sheet according to claim 1; and
   an electronic component.

10. A laminate,
    wherein two or more of the fiber sheets according to claim 1 are laminated.

11. The laminate according to claim 10, comprising a plurality of conductor layers,
    wherein the conductor layers are electrically conductive with each other by plating or a conductive composition.

12. A circuit board configured to use the laminate according to claim 10.

13. An electronic board comprising the laminate according to claim 10 and an electronic component.

14. A fiber sheet comprising:
    a resin layer containing thermosetting resin and a curing agent; and
    a fiber layer formed of a woven fabric, the fiber layer having stretchability only in a desired direction,
    wherein
    the fiber sheet is stretchable by 1% or more,
    an initial tensile elastic modulus of the fiber sheet is 5 MPa or more and 10 GPa or less,
    the thickness of the resin layer is within a range of 50 μm to 5000 μm,
    a glass transition temperature of the thermosetting resin is 60° C. or lower, and
    at least a portion of at least one surface of the fiber layer is impregnated with the resin layer.

15. A fiber sheet comprising:
    a resin layer having a plane shape and a plane area containing a thermosetting resin; and
    a fiber layer,
    wherein
    the fiber sheet is stretchable by 1% or more,
    an initial tensile elastic modulus of the fiber sheet is 5 MPa or more and 10 GPa or less,
    the thickness of the resin layer is within a range of 50 μm to 5000 μm,
    a glass transition temperature of the thermosetting resin is 60° C. or lower, and at least a portion of at least one surface of the fiber layer is impregnated with the resin layer across the entirety of the plane area.

\* \* \* \* \*